United States Patent
He et al.

(10) Patent No.: US 10,115,673 B1
(45) Date of Patent: Oct. 30, 2018

(54) EMBEDDED SUBSTRATE PACKAGE STRUCTURE

(71) Applicant: Holien Technology Co., LTD., Zhubie, Hsinchu County (TW)

(72) Inventors: Sung-Lien He, Zhubie (TW); Chun-Yuan Hou, Zhubie (TW); Tung-Chuan Wang, Zhubie (TW); Hsi-Ying Yuan, Zhubie (TW); Feng-Yi Chang, Zhubie (TW)

(*) Notice: Subject to any disclaimer, the term of this patent is extended or adjusted under 35 U.S.C. 154(b) by 0 days.

(21) Appl. No.: 15/817,758

(22) Filed: Nov. 20, 2017

(30) Foreign Application Priority Data

Apr. 26, 2017 (TW) .............................. 106114011 A

(51) Int. Cl.
- *H01L 23/12* (2006.01)
- *H01L 23/485* (2006.01)
- *H01L 23/053* (2006.01)
- *H01L 23/538* (2006.01)
- *H01L 23/367* (2006.01)

(52) U.S. Cl.
CPC ...... *H01L 23/5389* (2013.01); *H01L 23/3672* (2013.01); *H01L 23/5384* (2013.01); *H01L 23/5385* (2013.01); *H01L 23/5386* (2013.01)

(58) Field of Classification Search
CPC ............. H01L 23/5386; H01L 23/5389; H01L 23/5384; H01L 23/3675; H01L 23/538; H01L 23/5383; H01L 23/5226; H01L 23/3128; H01L 23/5385; H01L 23/49822; H01L 23/49833
See application file for complete search history.

(56) References Cited

U.S. PATENT DOCUMENTS

| | | | | |
|---|---|---|---|---|
| 2005/0211465 A1* | 9/2005 | Sunohara | ............ | H01L 23/5389 174/260 |
| 2009/0072384 A1* | 3/2009 | Wong | .................. | H01L 23/3677 257/712 |
| 2011/0042800 A1* | 2/2011 | Hsu | ..................... | H01L 23/5389 257/698 |
| 2016/0126126 A1* | 5/2016 | Chen | .................. | H01L 21/6835 257/738 |

* cited by examiner

*Primary Examiner* — Jasmine Clark
(74) *Attorney, Agent, or Firm* — Lin & Associates Intellectual Property, Inc.

(57) ABSTRACT

Provided is an embedded substrate package structure, including, from top to bottom, a fourth dielectric layer, a second substrate, a chip with a fifth dielectric layer, a third dielectric layer, a second dielectric layer, a first substrate and a first dielectric layer; wherein the substrates are disposed respectively with wire layers and through holes, and each of dielectric layers is disposed with openings, conductive bumps or conductive pads, wire layers, through holes, and chip to collectively form electrical connection. The chip is electrically connected to the substrate in a flip-chip manner, and the back of the chip interfaces a dielectric layer. Compared to the prior art which chip bonding is in face-up mode, the packaging structure with the face-down chip of the present invention can simplify the manufacturing process by the flip-chip method.

8 Claims, 3 Drawing Sheets

EMBEDDED SUBSTRATE PACKAGE STRUCTURE

CROSS-REFERENCE TO RELATED APPLICATION

This application claims the priority of Taiwanese patent application No. 106114011, filed on Apr. 26, 2017, which is incorporated herewith by reference.

BACKGROUND OF THE INVENTION

1. Field of the Invention

The technical field generally relates to an embedded substrate package structure.

2. The Prior Arts

As a response to the trend of continuous miniaturization of multi-function electronic products, various semiconductor package technologies have been developed. For example, by stacking chips in packaging, the size of the electronic products is reduced; by using high-density substrate to connect chip with chip, a multi-chip module (MCM) packaging can realize system and sub-system modularization. In addition, flip-chip packaging, system on a chip (SoC), system in a package (SiP) technologies are either widely used or considered as potentially highly applicable technologies.

U.S. Pat. No. 8,115,297 disclosed a substrate structure with die embedded inside and dual build-up layers over both side surfaces and method thereof. The structure includes a first substrate, having a die connected to a metal pad, and a first circuit and a second circuit, formed respectively on both side surfaces of the first substrate; a second substrate, having an opening for receiving the die, and a third circuit and a fourth circuit, formed respectively on both side surfaces of the second substrate. By using an adhesive glue to fill between gaps between the die and the first substrate, and between the die and the second substrate, and using laser to cut the back of the first substrate to form an opening to expose a metal layer on the back of the die.

It should be noted that in the aforementioned structure and manufacturing process, the die is electrically connected to the substrate in a facing-up manner; moreover, the back of the die is directly connected to the substrate. Also, after the die is placed properly, the glue filling process is performed to fix the die. Then, a redistribution layer (RDL) is formed, followed by wire connection. Hence, the packaging process is complicated.

SUMMARY

To overcome the aforementioned disadvantages of the conventional technology, the object of the present invention is to provide an embedded substrate package structure, which uses flip-chip approach to form electric connection with the substrate. The process is simple compared to the conventional technology.

An embodiment of the present invention provides an embedded substrate package structure, including: a first substrate, a second substrate, a first dielectric layer, a second dielectric layer, a third dielectric layer, a fourth dielectric layer, and a fifth dielectric layer; wherein the first substrate being disposed with a plurality of first through holes, and having an upper surface and a lower surface disposed respectively with a first upper wire layer and a first lower wire layer, the first upper wire layer and the first lower wire layer being electrically connected by the plurality of first through holes; the first dielectric layer covering the first lower wire layer on the lower surface of the first substrate, and having a plurality of openings located at position of the first lower wire layer to expose a portion of surface of the first lower wire layer, and the exposed surface being disposed with a conductive bump; the second dielectric layer covering the first upper wire layer on the upper surface of the first substrate, and having a plurality of openings located at position of the first upper wire layer to expose a portion of surface of the first upper wire layer, and the exposed surface being disposed with a conductive bump, and the conductive bump having a solder bump and an under-bump metallurgy; the second substrate being disposed with at least a cavity and a plurality of second through holes, the at least a cavity being for accommodating a chip, and the second substrate having an upper surface and a lower surface disposed respectively with a second upper wire layer and a second lower wire layer; the third dielectric layer covering the second lower wire layer on the lower surface of the second substrate, and having a plurality of openings located at position of the second lower wire layer to expose a portion of surface of the second lower wire layer, and the exposed surface being disposed with a conductive bump, and the conductive bump having a solder bump and an under-bump metallurgy; the fourth dielectric layer covering the second upper wire layer and the chip, serving as a protective layer of the back of the chip, and having a plurality of openings located at position of the second upper wire layer to expose a portion of surface of the second upper wire layer, and the exposed surface being disposed with a conductive bump, and the conductive bump having a solder bump and an under-bump metallurgy; and the fifth dielectric layer covering surroundings of the chip to fill gaps between the chip and the cavity and fixing the chip to inside of the cavity; the second dielectric layer and the third dielectric layer respectively having a plurality of openings at position of the cavity, and inside of the plurality of openings being disposed with a under bump metallurgy or a solder bump, a conductive bump or a solder bump being previously formed on a pad of the chip; when the chip being placed into the cavity, the chip being electrically connected to the first upper wire layer of the first substrate through the conductive bump or the solder bump.

BRIEF DESCRIPTION OF THE DRAWINGS

The embodiments can be understood in more detail by reading the subsequent detailed description in conjunction with the examples and references made to the accompanying drawings.

DETAILED DESCRIPTION OF THE DISCLOSED EMBODIMENTS

Figure 1:
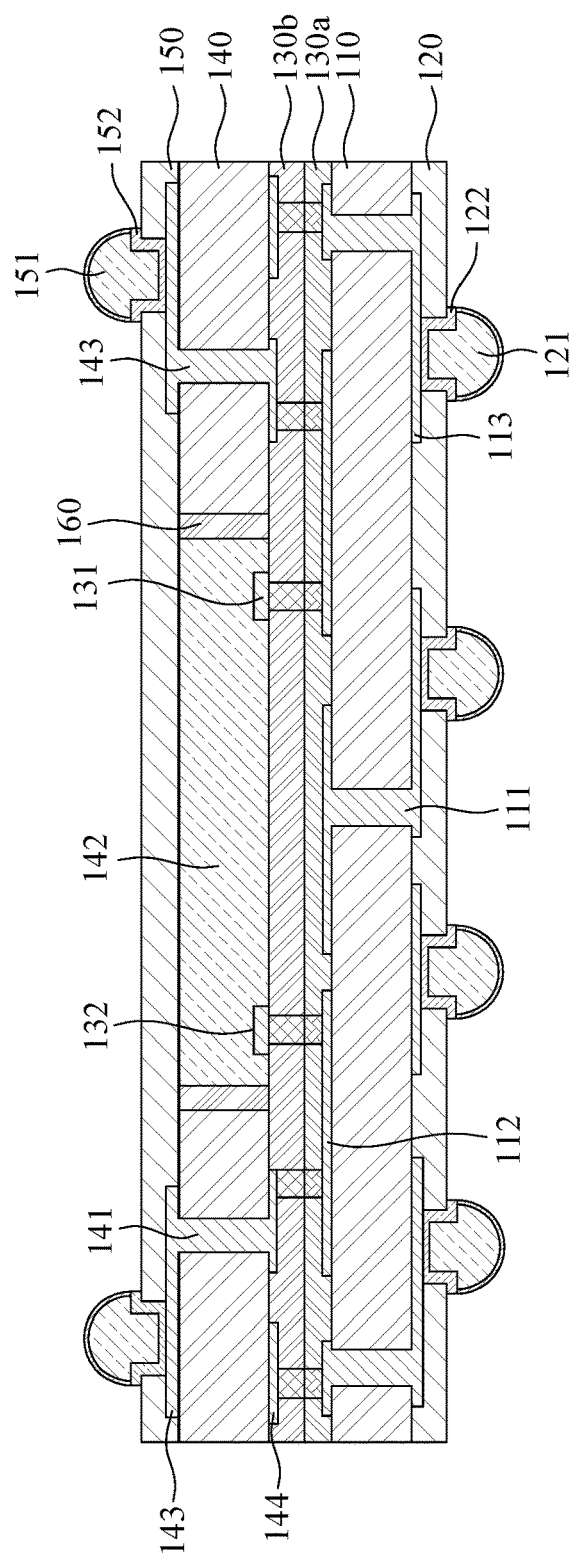
FIG. 1 shows a schematic view of a cross-section of the embedded substrate package structure according to the present invention.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to an embodiment of the present invention shown in FIG. 1, the embedded substrate package structure includes: a first substrate 110, a second substrate 140, a first dielectric layer 120, a second dielectric layer 130a, a third dielectric layer 130b, a fourth dielectric layer 150, and a fifth dielectric layer 160. The following describes the relative connections among the different layers.

Wherein, the first substrate 110 is disposed with a plurality of first through holes 111, and has an upper surface and a lower surface disposed respectively with a first upper wire layer 112 and a first lower wire layer 113, the first upper wire layer 112 and the first lower wire layer 113 are electrically connected by the plurality of first through holes 111.

The first dielectric layer 120 covers the first lower wire layer 113 on the lower surface of the first substrate 110, and has a plurality of openings located at position of the first lower wire layer 113 to expose a portion of surface of the first lower wire layer 113, and the exposed surface is disposed with a conductive bump, the conductive bump further includes a solder bump 121 and a under bump metallurgy 122 (UBM).

The second dielectric layer 130a covers the first upper wire layer 112 on the upper surface of the first substrate 110, and has a plurality of openings located at position of the first upper wire layer 112 to expose a portion of surface of the first upper wire layer 112, the exposed surface is disposed with a conductive bump, and the conductive bump includes a solder bump and an under-bump metallurgy.

The second substrate 140 is disposed with at least a cavity and a plurality of second through holes 141, the at least a cavity is for accommodating a chip 142, and the second substrate 140 has an upper surface and a lower surface disposed respectively with a second upper wire layer 143 and a second lower wire layer 144; the second upper wire layer 143 and the second lower wire layer 144 are electrically connected through the plurality of second through holes 141.

The third dielectric layer 130b covers the second lower wire layer 144 on the lower surface of the second substrate 140, and has a plurality of openings located at position of the second lower wire layer 144 to expose a portion of surface of the second lower wire layer 144, the exposed surface is disposed with a conductive bump, and the conductive bump includes a solder bump and an under-bump metallurgy. The fourth dielectric layer 150 covers the second upper wire layer 143 and the chip 142, serving as a protective layer of the back of the chip 142, and having a plurality of openings located at position of the second upper wire layer 143 to expose a portion of surface of the second upper wire layer 143, and the exposed surface being disposed with a conductive bump, and the conductive bump having a solder bump 151 and an under-bump metallurgy 152.

The fifth dielectric layer 160 covers surroundings of the chip 142 to fill gaps between the chip 142 and the cavity and fix the chip 142 to inside of the cavity.

The third dielectric layer 130b has a plurality of openings at position of the cavity, and a conductive bump or a metal bump 131 previously formed on a pad 132 of the chip 142. When the chip 142 is placed into the cavity, the chip 142 is electrically connected to the first upper wire layer 112 of the first substrate 110 through the conductive bump or the metal bump 131.

In other words, according to the above description, the embedded substrate package structure of the present invention includes, from top to bottom, a fourth dielectric layer 150, a second substrate 140, a chip 142 with a fifth dielectric layer 160, a third dielectric layer 130b, a second dielectric layer 130a, a first substrate 110 and a first dielectric layer 120; wherein the substrates are disposed respectively with wire layers and through holes, and each of dielectric layers is disposed with openings, conductive bumps or conductive pads, wire layers, through holes, and chip to collectively form electrical connection.

It should be noted that in the embedded substrate package structure of the present invention, the chip is electrically connected the substrate by a flip-chip technology; moreover, the back of the chip interfaces a dielectric layer. Compared to the prior art which chip bonding is in face-up mode, the packaging structure with the face-down chip of the present invention can simplify the manufacturing process by the flip-chip method.

Based on the above embedded substrate package structure, during manufacturing, the first substrate and the second substrate can be finished with necessary wiring, under bump metallurgy through holes, and/or cavity, respectively; the pad 132 of the chip is formed with a conductive bump or a solder bump in advance. Then, after alignment, an adhesive dielectric material is used to attach. The chip is then placed by the means of flip-chip and soldered to the wire layer on the substrate, followed by filling the glue. Finally, bumps or solder bumps are fabricated to accomplish manufacturing.

The present invention is applicable to an integrated circuit (IC), sensor, bio-chips, passive elements, and so on.

Furthermore, the first substrate 110 and the second substrate 140 are made of polymer, plastic, ceramic, metal, silicon wafer, compound material (BT, FR4 . . . ), glass or flexible substrate. The first upper wire layer 112, first lower wire layer 113, first through holes 111, second upper wire layer 143, second lower wire layer 144, second through holes 141, and conductive bumps are made of conductive materials, such as, Cu, Ag, Ni, Au, Sn, alloy, or compound material such as silver glue, carbon glue, and so on. The first dielectric layer 120, second dielectric layer 130a, third dielectric layer 130b, and fourth dielectric layer 150 are made of PI, BCB, silicon, resin, polymer, or similar compound materials.

Figure 2:
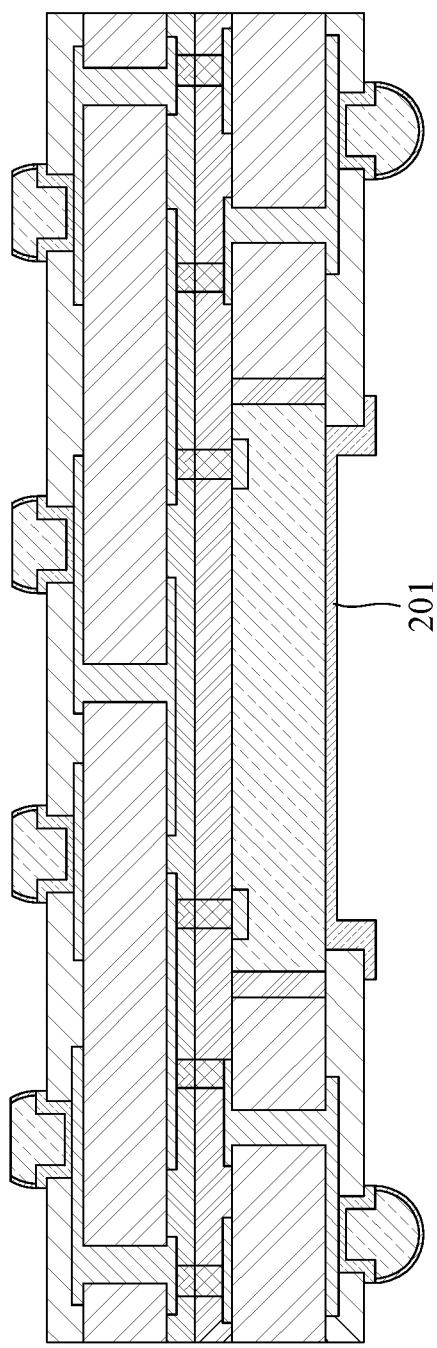
FIG. 2 shows an embodiment of the embedded substrate package structure of the present invention applied to packaging chip with an additional heat-dissipation structure.

FIG. 2 shows an embodiment of the embedded substrate package structure of the present invention applied to packaging chip with an additional heat-dissipation structure. As shown in FIG. 2, the fourth dielectric layer is disposed with a window at position of the chip. The window is further disposed with a heat-dissipation structure 201 to contact the chip to dissipate the heat generated by the chip. The heat dissipation structure 201 is made of heat-conductive material, such as, metal, ceramic or heat-conductive materials. The remaining structure is the same as previously described, and the details will not be repeated here.

In addition, when the present invention is applied to system in package (SiP), the passive elements or other elements can be stacked on the first dielectric layer or the fourth dielectric layer (not shown) to reduce the volume and weight of the package, as well as reduce the power consumption.

Similarly, when the application is applied to fingerprint recognition, the first substrate can be replaced with a thinner substrate (<100 μm) or a flexible substrate. Various potential applications can be explored. For those with ordinary skills regarding this field should be infer to other exemplars, and those exemplars are also within the scope of the present invention.

Figure 3:
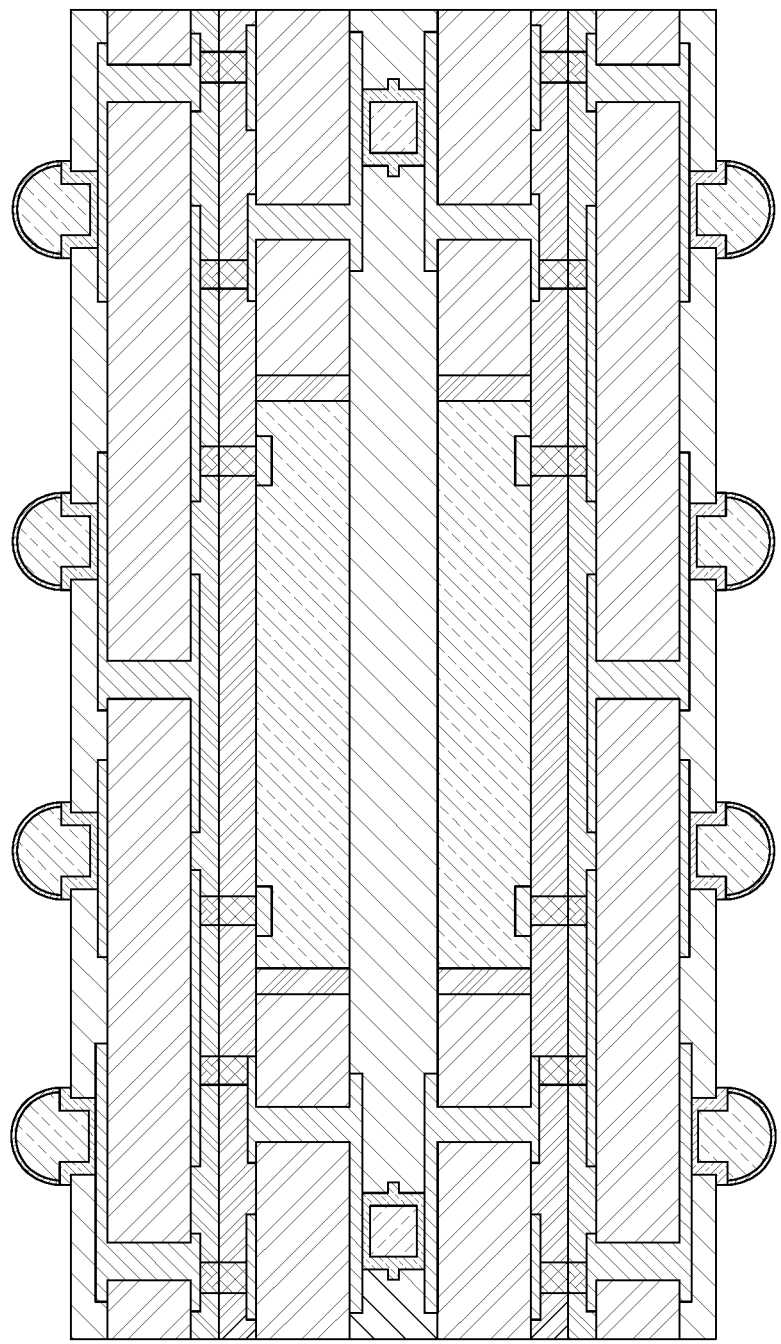
FIG. 3 shows an embodiment of the embedded substrate package structure of the present invention applied to stacked packaging.

FIG. 3 shows an embodiment of the embedded substrate package structure of the present invention applied to stacked packaging. As shown in FIG. 3, the fourth dielectric layer and/or the first dielectric layer of the main structure in FIG. 1 and FIG. 2, with appropriate wiring connection to form a stacked embedded substrate package structure.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An embedded substrate package structure, comprising: a first substrate being disposed with a plurality of first through holes, and having an upper surface and a lower surface disposed respectively with a first upper wire layer and a first lower wire layer, the first upper wire layer and the first lower wire layer being electrically connected by the plurality of first through holes;
    a first dielectric layer covering the first lower wire layer on the lower surface of the first substrate, and having a plurality of openings located at a position of the first lower wire layer to expose a portion of a surface of the first lower wire layer, and the exposed surface being disposed with a conductive bump;
    a second dielectric layer covering the first upper wire layer on the upper surface of the first substrate, and having a plurality of openings located at a position of the first upper wire layer to expose a portion of a surface of the first upper wire layer, and the exposed surface being disposed with a conductive bump, and the conductive bump comprising a solder bump and an under-bump metallurgy;
    a second substrate being disposed with at least a cavity and a plurality of second through holes, the at least a cavity being for accommodating a chip, and the second substrate having an upper surface and a lower surface disposed respectively with a second upper wire layer and a second lower wire layer;
    a third dielectric layer covering the second lower wire layer on the lower surface of the second substrate, and having a plurality of openings located at a position of the second lower wire layer to expose a portion of a surface of the second lower wire layer, and the exposed surface being disposed with a conductive bump, and the conductive bump comprising a solder bump and an under-bump metallurgy;
    a fourth dielectric layer covering the second upper wire layer and the chip, serving as a protective layer of the back of the chip, and having a plurality of openings located at a position of the second upper wire layer to expose a portion of a surface of the second upper wire layer, and the exposed surface being disposed with a conductive bump, and the conductive bump comprising a solder bump and an under-bump metallurgy; and
    a fifth dielectric layer covering surroundings of the chip to fill gaps between the chip and the cavity and fixing the chip to inside of the cavity, wherein the second dielectric layer and the third dielectric layer respectively have a plurality of openings at positions of the cavity, inside of the plurality of openings being disposed with an under bump metallurgy or a solder bump, and a conductive bump or a solder bump is formed on a pad of the chip, the chip being disposed in the cavity and electrically connected to the first upper wire layer of the first substrate through the conductive bump or the solder bump.

2. The embedded substrate package structure as claimed in claim 1, wherein the portions of surfaces the first lower wire layer and the first upper wire layer exposed respectively by the first dielectric layer and the second dielectric layer are further disposed with a conductive bump, and the conductive bump further comprises a solder bump and an under bump metallurgy.

3. The embedded substrate package structure as claimed in claim 1, wherein the portions of surfaces the second lower wire layer and the second upper wire layer exposed respectively by the third dielectric layer and the fourth dielectric layer are further disposed with a conductive bump, and the conductive bump further comprises a solder bump and an under bump metallurgy.

4. The embedded substrate package structure as claimed in claim 1, wherein a window is disposed on the fourth dielectric layer at a position above the chip, and the window is disposed with a heat dissipation structure contacting the chip.

5. The embedded substrate package structure as claimed in claim 1, wherein the first substrate and the second substrate are made of polymer, plastic, ceramic, metal, silicon wafer, compound materials (BT, FR4), glass or flexible substrate.

6. The embedded substrate package structure as claimed in claim 1, wherein the chip is an integrated circuit (IC), a sensor, a bio-chip or a passive element.

7. The embedded substrate package structure as claimed in claim 1, wherein the first upper wire layer, first lower wire layer, first through holes, second upper wire layer, second lower wire layer, second through holes, and conductive bumps are made of conductive materials, such as, Cu, Ag, Ni, Au, Sn, alloy or compound materials of silver glue or carbon glue.

8. The embedded substrate package structure as claimed in claim 1, wherein the first dielectric layer, second dielectric layer, third dielectric layer, and fourth dielectric layer are made of PI, BCB, silicon, resin, polymer, or similar compound materials.

* * * * *